(12) United States Patent
Nazuka

(10) Patent No.: US 6,605,355 B1
(45) Date of Patent: Aug. 12, 2003

(54) EPOXY RESIN COMPOSITION

(75) Inventor: Ken Nazuka, Tokyo (JP)

(73) Assignee: Three Bond Co., Ltd., Tokyo (JP)

( * ) Notice: Subject to any disclaimer, the term of this patent is extended or adjusted under 35 U.S.C. 154(b) by 0 days.

(21) Appl. No.: 09/913,355

(22) PCT Filed: Feb. 9, 2000

(86) PCT No.: PCT/JP00/00718

§ 371 (c)(1),
(2), (4) Date: Aug. 13, 2001

(87) PCT Pub. No.: WO00/49087

PCT Pub. Date: Aug. 24, 2000

(30) Foreign Application Priority Data

Feb. 18, 1999 (JP) .......... 11-039665

(51) Int. Cl.⁷ .......... B32B 27/38; B05D 3/02; C08L 63/00

(52) U.S. Cl. .......... 428/414; 428/413; 428/901; 427/386; 427/96; 525/523; 525/524; 528/93; 528/94; 528/103; 528/103.5

(58) Field of Search .......... 427/386, 58, 96; 428/413, 414; 525/523, 524, 533

(56) References Cited

U.S. PATENT DOCUMENTS

| | | | | |
|---|---|---|---|---|
| 4,390,664 A | * | 6/1983 | Kanayama | 525/117 |
| 5,218,234 A | | 6/1993 | Thompson et al. | |
| 5,271,612 A | * | 12/1993 | Yada et al. | 267/158 |
| 5,457,165 A | * | 10/1995 | Hermansen et al. | 525/113 |
| 5,585,421 A | * | 12/1996 | Kawano et al. | 523/443 |
| 5,726,216 A | * | 3/1998 | Janke et al. | 522/129 |
| 2001/0014399 A1 | * | 8/2001 | Jasne | 428/413 |

FOREIGN PATENT DOCUMENTS

| | | | | |
|---|---|---|---|---|
| JP | 5-102343 | 4/1993 | .......... | H01L/23/15 |
| JP | 5-251516 | 9/1993 | .......... | H01L/21/60 |
| JP | 6-69280 | 3/1994 | .......... | H01L/21/60 |
| JP | 6-77264 | 3/1994 | .......... | H01L/21/52 |
| JP | 9-40747 | 2/1997 | .......... | C08G/59/20 |
| JP | 9-59349 | 3/1997 | .......... | C08G/59/42 |
| JP | 10-64932 | 3/1998 | .......... | H01L/21/56 |
| JP | 10-101906 | 4/1998 | .......... | C08L/63/00 |
| JP | 10-158366 | 6/1998 | .......... | C08G/59/50 |
| JP | 10-204259 | 8/1998 | .......... | C08L/63/00 |
| WO | 98/31738 | 7/1998 | .......... | C08K/5/09 |

OTHER PUBLICATIONS

International Search Report.

* cited by examiner

*Primary Examiner*—Robert Dawson
*Assistant Examiner*—Michael J Feely
(74) *Attorney, Agent, or Firm*—Sughrue Mion, PLLC

(57) ABSTRACT

An epoxy resin composition comprising, as main components, (a) 100 parts by weight of a polyfunctional epoxy resin which stays liquid at an ordinary temperature and has two or more glycidyl groups in the molecule thereof, (b) 3 to 80 parts by weight of a curing agent and (c) 1 to 100 parts by weight of a modified epoxy resin, is suitable as an underfill sealing agent, is capable of heat-curing in a short time with a good productivity, is capable of surely connecting a semiconductor device such as a CSP and a BGA on a wiring board without giving an adverse effect on each part disposed on the wiring board by heat-curing at a relatively low temperature, has excellent heat shock property (temperature cycling property) and impact resistance, is free from bleeding of contaminants from its cured product, and is capable of easily detaching the CSP or BGA from the wiring board in the case where a defect is found, making it possible to reuse a normal wiring board or semiconductor device.

6 Claims, 1 Drawing Sheet

EPOXY RESIN COMPOSITION

TECHNICAL FIELD

The present invention relates to an underfill sealing agent to be used for mounting, onto a wiring board, a semiconductor device such as a chip size package (Chip Size/Scale Package; hereinafter abbreviated as a CSP) and a ball grid array (Ball Grid Array; hereinafter abbreviated as a BGA), which has a semiconductor element such as an LSI and a bear IC chip disposed on a carrier base.

BACKGROUND ART

Recently, with the propagation of small size electronic appliances such as a portable phone, a camera-integrated VTR, and a laptop personal computer, downsizing of an LSI device and an IC chip has been demanded. Further, CSPs and BGAs are propagated for achieving a small size like a bear chip and improving the characteristics while maintaining the characteristics of the package, which include protecting the semiconductor bear chip such as an LSI and facilitating a test.

The CSP and the BGA are connected with a wiring on a wiring board by a solder or the like. However, in some cases the connection reliability between the board and the CSP or BGA cannot be maintained in the case a temperature cycle is applied after the mounting operation. In general, after mounting the CSP and the BGA on the wiring board, a sealing resin is introduced into the gap between the CSP or BGA and the board (underfill sealing) for alleviating the stress by the temperature cycle and improving the heat shock resistance property, so as to improve the reliability of the electric connection. Moreover, the underfill sealing agent is used also as a reinforcing agent for fall prevention of the CSP or BGA due to impact by dropping or the like.

As the underfill sealing agents, thermosetting type epoxy resins, acrylic resins (Japanese Patent No. 2,746,035, JP-A-10-101906 (The term "JP-A" as used herein means an "unexamined published Japanese patent application"), JP-A-10-158366, JP-A-10-64932) and the like have been conventionally used. However, a problem is involved in that since a thermosetting resin is used as the sealing material, in the case where a defect of an LSI on a CSP or BGA, a defect of the connection between a CSP or BGA and a wiring board, or the like is found after mounting the CSP or BGA on the wiring board, it is extremely difficult to peeling off the thermosetting resin for replacement of the CSP or BGA.

Moreover, JP-A-5-102343 discloses a mounting method comprising fixing and connecting a bear chip on a wiring board using a photo-curing adhesive, and eliminating it in the case of having a defect. A problem is involved in that since the photo-curing adhesive is used, the method is limited only to a transparent substrate that allows light irradiation, such as a glass.

Furthermore, JP-A-6-69280 discloses a method comprising fixing and connecting a bear chip and a substrate using a resin to be cured at a predetermined temperature, and detaching the bear chip, when it has a defect, by softening the resin at a temperature higher than the predetermined temperature. However, any specific disclosure on the adhesive is not given in this publication. A method satisfying both the reliability and the repair characteristic has not been known.

Then, for peeling off a substrate from the above-mentioned curing resin, a peeling operation has been made by soaking in an organic solvent or the like. However, the performance inherent to the adhesive is deteriorated if the peeling property (repair property) is improved, and the peeling property is deteriorated if the bonding property and the durability of the adhesive are improved. An adhesive capable of combining the inherent function as an adhesive and the peeling property has not yet been known. In view of this, in JP-A-6-77264, a method of removing a resin residue by irradiating an electromagnetic wave, instead of peeling by swelling or dissolution using a solvent, is adopted. According to the method, not only the equipment becomes large-scale but also it merely removes the adhesive residue at most, and thus the adhesive peeling property itself cannot be improved dramatically.

In addition, JP-A-5-251516 discloses a mounting method comprising connecting and fixing a bear chip on a wiring board using a bisphenol A type epoxy resin, and removing it in the case of a defect. However, according to the method, detachment of the chip is not necessarily easy. In the case a method of cutting the chip by a milling process is adopted, since the chip itself is cut out mechanically, a problem arises in that the chip cannot be reused even in the case the chip is normal.

As an adhesive provided with a peeling property (repair property) for solving the above-mentioned problems, JP-A-10-204259 discloses a thermosetting resin composition for underfill sealing capable of heat-curing in a short time by adding a plasticizer to a one liquid type or two liquid type epoxy resin, capable of connecting a semiconductor device such as a CSP and a BGA with a wiring board, having the excellent heat shock resistance (temperature cycling property), and capable of easily detaching the CSP or BGA when a defect is found. However, according to the method, since a plasticizer is used, a problem is involved in that the resin strength, i.e., the durability, the heat resistance, and the heat cycling resistance is deteriorated, and the environment is contaminated due to bleeding of the plasticizer from its cured product.

Accordingly, in order to solve the above-mentioned problems, an object of the present invention is to provide an epoxy resin composition for underfill sealing, which is capable of heat-curing in a short time to provide good productivity, is capable of surely connecting a semiconductor device such as a CSP and a BGA on a wiring board without giving an adverse effect on each part disposed on the wiring board owing to heat-curing at a relatively low temperature, has excellent heat shock resistance (temperature cycling property) and impact resistance after curing, is free from bleeding of contaminants from its cured product, and is capable of easily detaching the CSP or BGA from the wiring board when a defect is found, so as to enable reuse of a normal wiring board or a semiconductor device.

DISCLOSURE OF THE INVENTION

The present invention provides an epoxy resin composition comprising, as main components, (a) 100 parts by weight of a polyfunctional epoxy resin which stays liquid at an ordinary temperature and has two or more glycidyl groups in the molecule thereof, (b) 3 to 80 parts by weight of a curing agent, and (c) 1 to 100 parts by weight of a modified epoxy resin.

Moreover, the present invention also relates to an underfill sealing method using the above-mentioned composition, and a circuit board produced utilizing the method.

Despite the fact that the epoxy resin composition of the present invention cures in a short time or at a relatively low temperature, it has excellent heat shock resistance (temperature cycling property) and impact resistance of its cured product. Besides, the cured product has a nature to be easily torn by heating and applying a force. Furthermore, the composition enables that its cured product adhered on a wiring board or the like can also be removed easily by heating.

The use of the thermosetting resin composition makes it possible to carry out heat-curing in a short time to give a good productivity, and makes it possible to connect a semiconductor device such as a CSP and a BGA surely on a wiring board without causing an adverse effect on each part on the wiring board by a relatively low temperature heat-curing. The semiconductor mounting structure after the connection has excellent heat shock resistance (temperature cycling property) and impact resistance. Moreover, bleeding of contaminants is not generated from its cured product. Therefore, since the semiconductor device can be detached easily in the case where a defect is found in the electric connection or the like, the semiconductor device, the wiring board or the like can be reused so that improvement of the yield in the production step, and reduction of the production cost can be achieved.

BEST MODE FOR CARRYING OUT THE INVENTION

Figure 1:
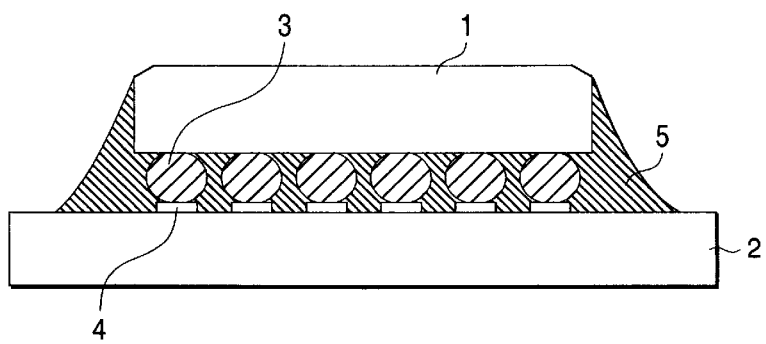
FIG. 1 shows an example of a mounting structure in which a semiconductor device is fixed on a wiring board using an epoxy resin composition of the present invention.

As the epoxy resin (a) for use in the present invention, a general polyfunctional epoxy resin which stays liquid at an ordinary temperature and has two or more glycidyl groups in the molecule thereof can be used. As needed, it may contain a monofunctional epoxy resin as an reactive diluent in an amount of about 0 to 30% by weight, preferably 0 to 20% by weight (each of which represents a weight percentage in the total epoxy resins). Here, the general polyfunctional epoxy resin which stays liquid at an ordinary temperature and has two or more glycidyl groups in the molecule thereof includes a bisphenol A type epoxy resin, a bisphenol F type epoxy resin, a bisphenol AD type epoxy resin, a phenol novolak type epoxy resin, a cresol novolak epoxy resin. These epoxy resins can be used as a mixture of two or more thereof. These epoxy resins can be selected in consideration of viscosity and physical property. In consideration of the viscosity, bisphenol F type epoxy resins and bisphenol AD type epoxy resins are preferred, and bisphenol F type epoxy resins are particularly preferred. Moreover, the molecular weight of the epoxy resin is suitably in a range of from 320 to 380.

It is preferred that the modified epoxy resin (c) for use in the present invention has a reactive group which lowers the glass transition point of the resin cured product and which is assembled as a part of a cross-linking structure at the time of curing. Specifically, compounds having one or more glycidyl group in its molecule as the reactive group are preferred. By the use of such a compound, a homogeneous cured product can be provided without the problem of bleeding of an unreacted component. Specific examples of the modified epoxy resins include plant oil-modified epoxy resins, liquid rubber-modified epoxy resins, dimer acid-modified epoxy resins, urethane-modified epoxy resins, acrylic-modified epoxy resins. Of these, plant oil-modified epoxy resins, liquid rubber-modified epoxy resins and dimer acid-modified epoxy resins are preferred, but it is not limited thereto as long as it is a modified epoxy resin having the above-mentioned nature. These modified epoxy resins may be used as a mixture of two or more thereof.

Examples of the plant oil-modified epoxy resin include plant oils having one or more glycidyl group in their molecules, such as a castor oil-modified product, a linseed oil-modified product, and a soy bean oil-modified product. Moreover, examples of the liquid rubber-modified epoxy resin include liquid rubber-modified products having one or more glycidyl group in their molecules, such as a liquid polyisoprene-modified product, a liquid polychloroprene-modified product, a liquid polybutadiene-modified product, and a liquid acrylonitrile-butadiene copolymer-modified product. In addition thereto, dimer acid-modified epoxy resins having a glycidyl group in their molecules or the like can be exemplified. Among these modified epoxy resins, plant oil-modified epoxy resins and dimer acid-modified epoxy resins having a low viscosity are particularly preferred in consideration of the viscosity. The preferred viscosity of the modified epoxy resin depends on the kind of the modified epoxy resin. For example, in the case of the plant oil-modified epoxy resins, those of 50,000 cps or less, in the case of the dimer-modified epoxy resins, those of 20,000 cps or less, and in the case of the liquid rubber-modified epoxy resins, those of 100,000 cps or less can be used preferably. Moreover, it is most preferable to use a plant oil-modified epoxy resin and a dimer acid-modified epoxy resin as a mixture. According to the use as a mixture, the heat shock resistance can further be improved so that a composition with a balanced performance can be obtained. The mixing ratio of the plant oil-modified epoxy resin and the dimer acid-modified epoxy resin is preferably 3:7 to 7:3 in terms of part by weight basis, and about 1:1 is particularly preferred.

The use amount of these modified epoxy resins (c) is generally from 1 to 100 parts by weight, preferably 3 to 50 parts by weight per 100 parts by weight of the epoxy resins (a). In the case it is less than 1 part by weight, the repair property may not be provided sufficiently. In the case it is more than 100 parts by weight, the strength of the cured product may be insufficient.

The epoxy resin composition according to the present invention can be of one liquid type with all the components being mixed, or of two liquid type in which an epoxy resin and a curing agent are stored separately so as to be mixed upon use. Therefore, as the curing agent (b) for use in the present invention, those generally used for a one liquid type epoxy resin and those generally used for a two liquid type epoxy resin as a curing agent can be used. In consideration of the operativity, those of a one liquid type are preferred. Specifically, potential curing agents including amine compounds such as a dicyan diamide, imidazol compounds, modified amine compounds, modified imidazol compounds and acid anhydrides can be exemplified.

Examples of the imidazol compound include, for example, a 2-methyl imidazol, a 2-ethyl-4-methyl imidazol, and a 2-phenyl imidazol.

Examples of the amine compound include epoxy compound-added polyamines having an epoxy compound added to an amine compound, and modified aliphatic polyamines.

Examples of the modified imidazol compound include imidazol-added products having an epoxy compound added to an imidazol compound.

Examples of the acid anhydride include, for example, a hexahydrophthalic anhydride, a methyl hexahydrophthalic anhydride, a methyl tetrahydrophthalic anhydride.

Among these potential curing agents, a modified imidazol compound is preferred in consideration of the thermosetting property at a low temperature. Depending on the curing condition, two or more kinds of the potential curing agents can be used in combination.

The blending amount of the curing agents (b) is generally from 3 to 80 parts by weight, preferably 5 to 50 parts by weight per 100 parts by weight of the epoxy resin. In the case it is less than 3 parts by weight, curing may be insufficient. In the case it is more than 80 parts by weight, an unreacted curing agent may remain in its cured product to thereby provide an adverse effect to the physical property such as humidity resistance.

The epoxy resin composition prepared accordingly can be selected and used in consideration of the physical property of easily permeating into a gap between a wiring board and a semiconductor device or of lowering the viscosity at least upon heating so as to permeate easily.

The epoxy resin composition according to the present invention may further contain, as needed, other additives, such as an antifoaming agent, a leveling agent, a dye, a pigment, a filler and an anticorrosion agent in a small amount so long as the object of the present invention can be achieved. For example, it is possible to impart photo-curing property by adding a photo polymerization initiator.

The composition of the present invention can be produced by a conventionally known mixing method, but in order to prevent introduction of bubbles into the composition, it is preferred to mix under a reduced pressure, or reduce the pressure of the mixed composition for degassing.

Next, the present invention will be described in detail with reference to the drawings. A mounting structure using the epoxy resin of the present invention is shown in FIG. 1.

A semiconductor device 1 is placed on a predetermined position of a wiring board 2 and electrically connected with electrodes 4 on the wiring board 2 side by solder bumps 3 on the semiconductor device 1 side. Underfill sealing is made with respect to the gap between the semiconductor device 1 and the wiring board 2 by a cured product 5 of an epoxy resin composition of the present invention in order to improve the reliability. The seal by the epoxy resin composition-cured product 5 need not fully fill the gap between the semiconductor device 1 and the wiring board 2, but it is sufficient to fill to the extent that the stress by the temperature cycle or the impact can be alleviated.

The semiconductor device that can be used with making use of the characteristics of the epoxy resin of the present invention includes a CSP and a BGA.

A wiring board for use in the present invention is not particularly limited, and substrates generally used as a wiring board, such as a glass epoxy, an ABS, and a phenol can be used.

Next, the mounting method will be explained. First, a solder paste is printed on a necessary portion of the wiring board 2. After optionally drying the solvent, the semiconductor device 1 is placed in accordance with the pattern on the board. By passing the board through a reflow furnace, the solder is melted to perform soldering. Here, the electric connection between the semiconductor device 1 and the wiring board 2 is not limited to the solder paste, but connection using a solder bump 3 (solder ball) can also be used. Moreover, connection by a conductive adhesive or an anisotropic conductive adhesive can be used as well. Furthermore, application or formation of the solder paste or the like can be carried out either on the wiring board side or the semiconductor device side. The solder or (anisotropic) conductive adhesive used herein is appropriately selected in terms of melting point, bonding strength or the like in consideration of the case of repair later.

After electrically connecting the semiconductor device and the wiring board as described above, it is generally preferred to conduct a conduction test or the like and subsequently to fix using the resin composition only when the test is passed. This is because it is easier to detach the parts before fixation in the case where a defect is found.

Next, using an appropriate application method such as a dispenser, an epoxy resin composition is applied around the semiconductor device. When the resin composition is applied, the resin composition permeates into the gap between the wiring board and a carrier base material of the semiconductor device owing to the capillary phenomenon.

Next, the epoxy resin composition is heated to cure. In the initial stage of the heating operation, the viscosity is lowered drastically so as to improve the flowability for further easier permeation between the wiring board and the semiconductor device. Moreover, by providing an appropriate ventilation hole in the board, or partly providing a portion on which the resin is not applied, sufficient permeation between the wiring board and the semiconductor device can be attained. The applied amount of the epoxy resin composition is adjusted appropriately so as to substantially fill it up the gap between the semiconductor device and the wiring board.

Herein, the curing conditions are, in the case of the above-mentioned epoxy resin composition is used, generally at 70° C. to 150° C. and for about 1 to 60 minutes. The curing conditions are adjusted depending on the selection and composition ratio of each component in accordance with the workability. For example, the curing is performed at a low temperature in the case where the influence of the heat on the wiring board or the like is concerned, and the curing is performed at a high temperature in a short time for improvement of the productivity. Through the above-described operations, the mounting structure as shown in FIG. 1 is completed.

Next, the repair work will be explained.

In the mounting method using the epoxy resin composition of the present invention, the characteristics of the semiconductor device, the connection of the semiconductor device and the wiring board, and other electric characteristics are examined after mounting the semiconductor device on the wiring board as described above. At this time, in the case where a defect is found, repair can be made as follows.

A part of the semiconductor having a defective portion is heated at about 150 to 300° C. for about 1 minute. The heating means is not particularly limited, but it is preferred to heat partially. For example, a relatively simple means such as applying a hot air to the defective portion can be used.

When the solder is melted and the resin is softened to have a reduced bonding strength, the semiconductor device is pulled off using a flat metal piece (scraper or the like). The state at this time is shown in FIG. 2.

Figure 2:
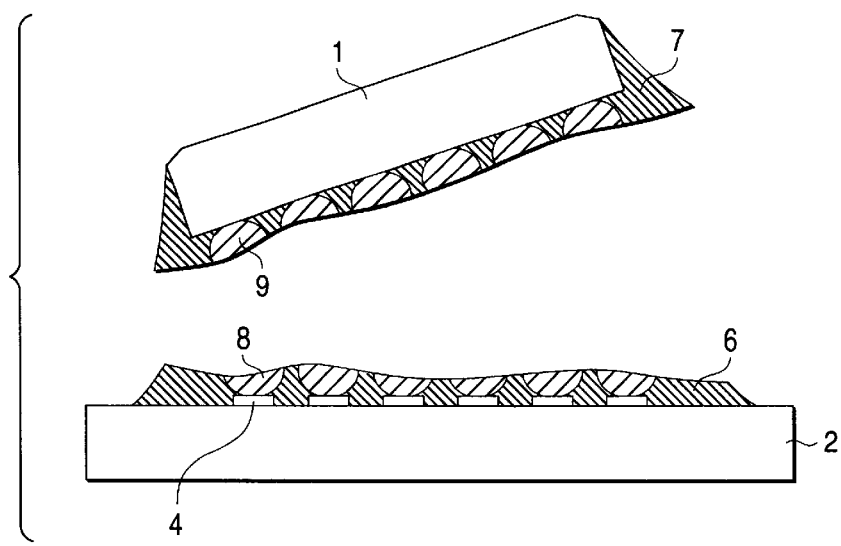
FIG. 2 shows an example of pulling off a semiconductor device from a wiring board for repair after curing the epoxy resin.

As shown in FIG. 2, after detaching the semiconductor device 1, a residue 6 of the epoxy resin composition-cured product and solder residues 8 remain on the wiring board 2. The residue 6 of the epoxy resin composition-cured product can be removed by heating to a predetermined temperature and scraping off by a scraper, a brush or the like, but it can be removed most easily by using a flat metal piece heated to 200 to 350° C. (hot knife, a solder trowel (with a flat tip end shape) or the like). At the time of removing the cured product residue, it should be carried out sufficiently cautiously for the risk of peeling off the pattern on the wiring board. Moreover, the solder residue 8 can be removed using, for example, a braided wire for absorbing the solder, or the like.

After removing the epoxy resin composition residue and the solder residue on the wiring board, the peeled surface is finished with an alcohol or the like. By mounting a semiconductor device again by the same process as mentioned above on the wiring board thus cleaned by the above-described operations, the repair of the defective portion can be completed.

In the case where a defect is found on the wiring board side, by removing the residue 7 of the epoxy resin composition-cured product and the solder residue 9 remaining on the semiconductor device side in the same manner, the semiconductor device can be reused.

The present invention will be illustrated in greater detail with reference to the following Examples.

(1) EPOXY RESIN COMPOSITIONS USED EXAMPLES 1 TO 3

Epoxy resin compositions were obtained by mixing the following epoxy resin A), curing agents B1) and B2), and modified epoxy products C1), C2) and C3) by the ratio shown in Table 1, and degassing.

A) Epoxy Resin:
 Bisphenol F type epoxy resin (produced by Yuka Shell Epoxy Corp., product name: EPI COAT 807)
B1) Curing Agent:
 Modified imidazol compound (produced by Ajinomoto Corp., product name: AMICURE PN-23)
B2) Ccuring Agent:
 Modified aliphatic amine (produced by Fuji Kasei Kogyo Corp., product name: FUJICURE FXE-1000)
C1) Modified Epoxy Resin:
 Dimer acid-modified product (produced by Yuka Shell Epoxy Corp., product name: EPI COAT 871)
C2) Modified Epoxy Resin:
 Soy bean oil-modified product (produced by Daiseru Kagaku Kogyo Corp., product name: DAIMAKKU S-300K)
C3) Modified Epoxy Resin:
 Castor oil-modified product (produced by Mitsui Kagaku Corp., product name: EPOMIKKU R151)

COMPARATIVE EXAMPLE 1

As shown in Table 1, the formulation was changed so that the modified epoxy resins C1) and C2) used in Examples 1 and 2, respectively, were not added.

COMPARATIVE EXAMPLES 2 AND 3

As shown in Table 1, the formulation was changed so that the addition amount of the modified epoxy resins C1) and C2) used in Examples 1 and 2, respectively, were increased.

COMPARATIVE EXAMPLE 4

As shown in Table 1, the formulation was changed so that the modified epoxy resins C1) and C2) used in Examples 1 and 2, respectively, were replaced with D) dioctyl phthalate.

TABLE 1

| Component | Ex. 1 | Ex. 2 | Ex. 3 | Comp. Ex. 1 | Comp. Ex. 2 | Comp. Ex. 3 | Comp. Ex. 4 |
|---|---|---|---|---|---|---|---|
| A) | 80 | 80 | 70 | 100 | 40 | 40 | 80 |
| B1) | 25 | 25 | — | 25 | 25 | 25 | 25 |
| B2) | — | — | 25 | — | — | — | — |
| C1) | 20 | — | 15 | — | 60 | — | — |
| C2) | — | 20 | — | — | — | 60 | — |
| C3) | — | — | 15 | — | — | — | — |
| D) | — | — | — | — | — | — | 20 |

(All the numerical values in the table are expressed in terms of parts by weight.)

(2) MOUNTING METHOD

As the CSP used for the examination, a square CSP having a 12 mm side length and a 176 pin terminal number was used. A solder paste was printed and supplied on an electrode of a wiring board (glass epoxy). The CSP was placed, and jointed by solder in a reflow furnace.

Thereafter, the epoxy resin composition was applied in the vicinity of the CSP using a dispenser. Then, it was heated at 80° C. for 60 minutes so as to cure the epoxy resin composition. At this time, the epoxy resin composition permeated between the semiconductor device and the wiring board before completely curing.

(3) HEAT SHOCK RESISTANCE TEST

The test was carried out under conditions where one cycle was defined as one hour including a lower temperature side holding for 30 minutes at −40° C. and a higher temperature side holding for 30 minutes at 80° C. A conduction test was conducted for the specimen per 100 cycles for observing the electric connection between the CSP and the board. Those having conduction after 1,000 or more cycles were judged as being passed, and those without conduction by disconnection or the like before reaching the number as being failed.

(4) IMPACT RESISTANCE TEST

After dropping 10 times onto a concrete from a 1.8 m height, a conduction test was conducted. The electric connection between the CSP and the board was observed. Those having conduction were judged as being passed, and those without conduction by disconnection or the like before reaching the number as being failed.

(5) REPAIR PROPERTY

The vicinity of the CSP fixed on a wiring board by an epoxy resin composition was heated by applying hot air of about 260° C. for 1 minute using a hot air generator. A scraper was inserted between the CSP and the glass epoxy substrate and lifted to detach the CSP.

Next, a resin and a solder remaining on the glass epoxy substrate were removed using a solder trowel (with a flat tip end shape) heated to 300° C. Moreover, a solder remaining on the glass epoxy substrate, which was not completely removed by the above operation was eliminated by a braided wire for absorbing a solder. The substrate surface was then cleaned with an alcohol or the like.

A solder paste was applied again on the glass epoxy substrate, from which the CSP was thus removed, and a new CSP was mounted. At this time, a solder paste may be printed on the new CSP side.

In the same manner as mentioned above, an epoxy resin composition was applied in the vicinity of the CSP, and subsequently heated at 80° C. for 60 minutes so as to cure the epoxy resin composition.

The cases where the thus repaired CSP mounted board has a secure electric connection, and shows the same characteristics as those was not repaired in the heat shock resistance test and the impact resistance test, were judged as being passed.

These results are shown in Table 2. In the table, "⊚" represents passed with a margin, "○" passed, "x" failed, and "-" not evaluated because of insufficient curing.

TABLE 2

|  | Ex. 1 | Ex. 2 | Ex. 3 | Comp. Ex. 1 | Comp. Ex. 2 | Comp. Ex. 3 | Comp. Ex. 4 |
|---|---|---|---|---|---|---|---|
| Heat shock resistance test | ○ | ○ | ⊚ | ○ | — | — | X |
| Impact resistance test | ○ | ○ | ○ | ○ | — | — | X |
| Repair property | ○ | ○ | ○ | X | — | — | ○ |

INDUSTRIAL APPLICABILITY

According to the present invention, an epoxy resin composition for underfill sealing, which is capable of heat-curing in a short time with a good productivity, is capable of surely connecting a semiconductor device such as a CSP and a BGA on a wiring board without giving an adverse effect on each part disposed on the wiring board by heat-curing at a relatively low temperature, has excellent heat shock resistance (temperature cycling property) and impact resistance, is free from bleeding of contaminants from its cured product, and is capable of easily detaching the CSP or the BGA from the wiring board in the case where a defect is found, making it possible to reuse a normal wiring board or semiconductor device, can be provided.

What is claimed is:

1. An epoxy resin composition comprising, as main components, (a) 100 parts by weight of a polyfunctional epoxy resin which stays liquid at an ordinary temperature and has two or more glycidyl groups in the molecule thereof, (b) 3 to 80 parts by weight of a curing agent selected from the group consisting of amine compounds, imidazol compounds and acid anhydrides, and (c) 1 to 100 parts by weight of a modified epoxy resin comprising a mixture of a plant oil-modified epoxy resin and a dimer acid-modified epoxy resin in a mixing ratio of 3:7 to 7:3 in terms of part by weight basis.

2. The epoxy resin composition according to claim 1, wherein the curing agent (b) comprises at least one member selected from the group consisting of amine compounds, imidazol compounds, modified amine compounds, modified imidazol compounds and acid anhydrides.

3. The epoxy resin composition according to claim 2, wherein the curing agent (b) is an amine compound comprising a modified aliphatic polyamine as its main component.

4. The epoxy resin composition according to claim 1, wherein the curing agent is an amine compound from the group consisting of dicyan diamide, 2-methyl imidazol, 2-ethyl4-methyl imidazol, 2-phenyl imidazol, epoxy compound-added polyamines having an epoxy compound added to an amine compound, modified aliphatic polyamines, imidazol-added compounds having an epoxy compound added to an imidazol compound, hexahydrophthalic anhydride, methyl hexahydrophthalic anhydride and methyl tetrahydrophthalic anhydride.

5. An underfill sealing method comprising the steps of applying an epoxy resin composition according to claim 1 in a gap between electrically connected semiconductor device and wiring board, and curing the applied epoxy resin composition.

6. A circuit board comprising a wiring board, a semiconductor device electrically connected on the wiring board, and a resin composition sealing a gap between the wiring board and the semiconductor device, wherein the resin composition is formed by applying an epoxy resin composition according to claim 1 in the gap between the semiconductor device and the wiring board, and curing the applied epoxy resin composition.

* * * * *